United States Patent [19]

Levchenko et al.

[11] Patent Number: 4,700,660
[45] Date of Patent: Oct. 20, 1987

[54] EVAPORATOR FOR DEPOSITING FILMS IN A VACUUM

[75] Inventors: Georgy T. Levchenko; Alexandr N. Radzikovsky, both of Kiev, U.S.S.R.

[73] Assignee: Kievsky Politekhnichesky Institut, Keiv, U.S.S.R.

[21] Appl. No.: 829,651

[22] PCT Filed: Apr. 24, 1985

[86] PCT No.: PCT/US85/00033

§ 371 Date: Jan. 28, 1986

§ 102(e) Date: Jan. 28, 1986

[87] PCT Pub. No.: WO86/00092

PCT Pub. Date: Jan. 3, 1986

[30] Foreign Application Priority Data

Jun. 12, 1984 [SU] U.S.S.R. ............................... 3753279

[51] Int. Cl.⁴ .............................................. C23C 14/24
[52] U.S. Cl. ...................................... 118/726; 427/250
[58] Field of Search ........................ 118/726; 427/250; 219/271, 272, 273, 274, 275, 276

[56] References Cited

U.S. PATENT DOCUMENTS 3,572,672  3/1971  Harel .................................... 427/250
4,125,086  11/1978  Vig et al. . 
4,412,508  11/1983  Ney et al. .

FOREIGN PATENT DOCUMENTS 206499  1/1984  Fed. Rep. of Germany .
134555  8/1982  Japan .
155368  9/1982  Japan .
270432  8/1970  U.S.S.R. .
397567  9/1973  U.S.S.R. .
413218  1/1974  U.S.S.R. .
466300  8/1975  U.S.S.R. .

OTHER PUBLICATIONS

Grant, Julius, *Hackh's Chemical Dictionary*, McGraw-Hill (©1972), p. 115.
Handbook Of Thin Film Technology, Leon I. Maissel And Reinhard Glang, pp. I–36 Through I-68.

*Primary Examiner*—Sam Silverberg
*Assistant Examiner*—Terry J. Owens
*Attorney, Agent, or Firm*—Fleit, Jacobson, Cohn & Price

[57] ABSTRACT

An evaporator for depositing films in a vacuum consisting of a crucible for containing an evaporant and adapted to be heated by a heater. A tube is provided for forming a directional flow of evaporant toward a substrate. The tube has a mounting structure at both ends so that the tube can be alternately mounted in the crucible at each end about a transverse symmetry plane.

11 Claims, 14 Drawing Figures

EVAPORATOR FOR DEPOSITING FILMS IN A VACUUM

FIELD OF THE INVENTION

This invention relates generally to the art of applying coatings to surfaces, and more particularly to an evaporator for vacuum depositing films.

BACKGROUND OF THE INVENTION

A major demand imposed on evaporators for vacuum film depositing is to obviate wastage of the evaporant failing to deposit on the substrate by ensuring its revaporization and to provide film thickness uniformity within a wide range of materials deposited on substantial surface areas of substrates.

Films can be deposited more uniformly by spacing the substrate at a considerable distance from the evaporator, whereas for reducing losses of the evaporant it is possible to recover the vaporized evaporant material failing to fall on the substrate.

By way of example, there is known a device for vacuum deposition of metal films on a substrate, which comprises a crucible with a substrate spaced therefrom both surrounded by a chamber serving to collect the evaporant failing to impinge onto the substrate. On terminating the process of vacuum plating, the evaporant deposited on the walls of this chamber is removed therefrom to be recharged to the crucible for revaporization. However, inherent in this device is a disadvantage of non-uniform thickness of the film deposited, because the distance from the crucible to the substrate is confined by the dimensions of the chamber. In addition, the evaporant material scraped off the walls of the chamber for reuse is contaminated by foreign impurities. Among the sources of such impurities are both the material of the chamber mixing with deposited evaporant during chamber walls cleaning, and residual gases of the vacuum chamber tending to condense on the walls of the chamber. The condensed residual gases are of considerable size since the substrate is rather remote from the crucible. Another disadvantage resides in much labour required for cleaning the chamber.

The process of cleaning the chamber can be made less labour-consuming by revaporization of the material condensed on the walls of the evaporant collecting chamber, which is offered by an apparatus for vacuum depositing disclosed in Japanese Application No. 57-134555, Int. Cl. C 23 C 13/00, 13/08, published Aug. 19, 1982. This apparatus comprises arranged in vacuum a vapor source in the form of a crucible having arranged thereabove a vapor collecting chamber which encloses the flow of vaporant traveling toward the substrate. This collecting chamber can be heated to the temperature of vaporant in the crucible or to a temperature sufficiently high for revaporizing the material deposited on the walls of the collecting chamber. Therefore, the evaporant material which does not impinge on the substrate tends to condense on the walls of the collecting chamber and thanks to high temperature of these walls is revaporized therefrom.

This apparatus also fails to ensure high purity of the film being deposited due to excessive liberation of gas from the collecting chamber because of the high temperature to which it is heated and its large size determined by the distance from the crucible to the substrate. For the same reason, the substrate is likewise heated to an intolerably high temperature by the heat radiating from the collecting chamber. Also, considerable losses of evaporant take place due to escape thereof through clearances between the crucible, collecting chamber and substrate.

Wastage of the evaporant material can be minimized, when the temperature of the collecting chamber is lowered. An attending advantage is associated with less pronounced overheating of the substrate. These advantages are materialized in a liquid phase regeneration device for vacuum deposition of films (cf., Japanese Application No. 57-155368, Int. Cl. C 23 C 13/00, 13/08, published Sept. 25, 1982) which comprises a crucible containing an evaporant with a collecting chamber arranged thereabove around the flow of vapor moving toward the substrate. The lower edge of the chamber occupies the upper part of crucible interior. During film deposition the vapor collecting chamber is heated to a temperature not below the melting point of the evaporant, whereas the liquid phase of the evaporant condensed in the collecting chamber trickles down its walls back to the crucible. However, such a liquid phase regeneration again fails to ensure low losses for a wide range of evaporants, since most of the evaporants used for vacuum film deposition have a vapor pressure at their melting point inducing vigorous evaporation. In view of the aforedescribed, the vapor still tends to escape through clearances between the crucible, collecting chamber and substrate. In addition, the high temperature of the collecting chamber determined by the temperature of the liquid phase of the evaporant causes outgassing and unwanted heating of the substrate.

Losses of the evaporant can be further minimized by eliminating clearances between the crucible and vapor collecting chamber, as well as by a more drastic reduction of the temperature of the vapor collecting chamber during film deposition process to a temperature substantially below the melting point of the material being deposited. The evaporant condensed on the walls of the collecting chamber can be caused to trickle down by periodically increasing their temperature to above the melting point of the evaporant. The attending advantageous effects include reduced gas liberation from the walls of the vapor collecting chamber and lowered temperature of the substrate. These advantages are materialized in an apparatus for vacuum deposition of metal films dislosed in U.S. Pat. No. 4,125,086 Int. Cl. C 23 C 13/08 published Nov. 14, 1978. This apparatus comprises an alumina crucible to contain an evaporant material in which there is immersed a tungsten tube having a hole in its side wall for the passage of vapor. Arranged opposite this hole is another hole for the passage of a portion of vapor and deposition on the substrate. The rest of the vapor is condensed on the wall of the crucible adjacent the hole. The crucible wall in this case serves as a means for directing the vapor flow. The device comprises separate heaters for the crucible and the tube. The temperature of the tube is maintained at a sufficiently high level to ensure vaporization and escape of the evaporant material from the hole. The temperature of the crucible is periodically raised for the evaporant condensed on its walls to trickle down, enter the tube, and vaporize.

However, during deposition of such metals as gold the tungsten components are wetted thereby to form a mechanical bond therewith, which due to different thermal expansion coefficients of gold and tungsten results in damage of the tungsten tube after several heating cycles. In addition, gold tends to leak through tungsten seals to render the apparatus inoperable.

Damage of the tube and leaks of the evaporant through the seals can be prevented by fabricating the apparatus from a material not wetted by the evaporant. One example is an evaporator for vacuum depositing films on substrates taught in U.S. Pat. No. 4,412,508, Int. Cl. C 23 C 13/08 published Nov. 1, 1983. The evaporator comprises a cylindrical graphite housing having a partition separating the housing into two parallel chambers. One such chamber, particularly the collimation chamber, functions as a means for guiding the flow of evaporant being deposited on the substrate and has in its side wall an aperture for impinging the flow of evaporant onto the substrate. The other, evaporation chamber, is provided with a coaxial graphite tube the side wall of which also has an aperture for the passage of vapor in line with the aperture of the collimation chamber, this line being perpendicular to the axis of the housing. The lower end of the collimation chamber forms a crucible communicating by a passage for conveying the liquid evaporant material to the evaporation chamber in which the liquid material ascends along a tungsten wick, because an electric current is applied to the tube for maintaining therein a high temperature. Having passed the aperture in the tube the vapor enters the collimation chamber wherein part of the vapor flows through the collimation aperture to impinge on the substrate, while the remainder of the vapor is condensed on the walls of the collimation chamber. This chamber is periodically heated by a separate heater to ensure that the liquid metal flows to the wick.

When used for depositing gold, this device features a long service life because it is fabricated from a material not wettable by gold, particularly graphite.

During film deposition the conditions for vapor emission from a small (about 0.5 mm) aperture in the tube at the normally practised rates of deposition make the flow dense or close to dense. Therefore, the vapor flow intensity distribution varies, depending on the conditions of emission, according to a higher cosine power, rather than according to the cosine of the angle relative to the centerline of the aperture. Therefore, the film thus deposited may have very non-uniform thickness; still more so, the larger is the surface area of the substrate.

Furthermore, since most of the materials used for film deposition tend to sufficiently vigorously evaporate at the temperature of melting point, then raising the temperature of the collimation chamber above the melting point for even a short period of time is liable to result in increased losses of the evaporant due to the lack of directional emission of vapor through the collimation aperture.

From various reference sources there are known seventy one evaporant materials widely practised in film deposition (cf., e.g., "Handbook of Thin Film Technology" edited by Leon I. Maissel and Reinhard Glans, published by the McGraw-Hill Book Company, New York, 1970, pp1-37, 1-38, 1-66, 1-68). Of them only twenty three have at the melting point a pressure of vapor not above $10^{-2}$ Torr. It has to be noted (see p. 1-36) that the materials evaporated intensively already at $10^{-2}$ Torr, which means that losses of other forty eight materials for film deposition will be considerable. Also, such materials as chromium, arsenic, some oxides and tellurides feature a vapor pressure at the melting point amounting to tens and hundreds Torr, or even higher, thus making such materials inapplicable for liquid regeneration.

It has also to be taken into account that, as evidence in the above cited U.S. patents, the optimum diameter of the tube in the evaporation chamber is 1.56 mm. At larger tube diameters the heat applied to the tube results in excessive temperature of the crucible and collimation chamber to eventually lead to extra losses of the evaporant. Conversely, the tube of such a diameter can hold but negligible amounts of the evaporant material sufficient only for producing a film of small thickness, after which the material occupying the collimation chamber must be transformed to liquid to thereby ensure its successive delivery to the tube. It follows then that the application of heat to the collimation chamber to raise its temperature to above the melting point of the evaporant must be more frequent, practically after each deposition cycle. When a film of more substantial thickness is to be deposited, the temperature of the collimation chamber needs to be continuously maintained above the evaporant melting point throughout the film deposition process. For example, if the pressure in the collimation chamber is $10^{-2}$ Torr, losses due to non-directed emission through the collimation aperture of the evaporant material vaporized in the collimation chamber may be as high as 70%.

In addition, to ensure a stable vapor deposition rate, the end of the wick enclosed by the tube must be immersed into the evaporant occupying the entire bottom portion of the crucible, which make the inventory of the evaporant material quite considerable. Therefore, the minimum initial quantity of evaporant charged amounts to tens of grams, which may entail unjustifiable expenses because such an amount of precious and costly materials by far exceeds the quantity to be eventually evaporated, whereas the continuous presence of the evaporant material in the crucible and in the by-pass conduit is necessitated exclusively by the normal functioning of the apparatus.

The aforedescribed apparatus has two separate heaters to accurately maintain the temperature of the evaporation and collimation chambers. Otherwise, for example, in the case of a failure to accurately maintain the temperature of the collimation chamber, losses of the material occupying this chamber in the course of its retrieval for eventual reuse by making it flow to the evaporation chamber may grow considerably. The requirement of providing two heaters and, consequently, two temperature control systems, renders the aforedescribed apparatus overcomplicated in operation.

SUMMARY OF THE INVENTION

The present invention is directed toward the provision of an evaporator for vacuum deposition of films having such a means for forming a directed flow of evaporant, that would make it possible to prevent losses of the evaporant material failing to impinge onto a substrate during its recovery for revaporization, and ensure a uniformly distributed film thickness over a larger surface area of the substrate when using a wider range of evaporant materials.

The aims of the invention are attained by an evaporator for depositing films in a vacuum comprising a crucible containing an evaporant material provided with a heater and communicating with a means for forming a directed flow of evaporant according to the invention, the means for forming the directed flow of evaporant is fashioned as a tube, of which one end is received in the crucible, having a transverse symmetry plane to enable it to be alternately arranged in the crucible at its first or second end.

Preferably, the tube varies in cross-section lengthwise.

Advantageously, at least one annular recess is provided in the tube at the midportion thereof.

Favorably, the evaporator will have a membrane arranged in the tube and provided with an aperture in the tube symmetry plane, the said membrane to provide means for correcting the distribution of directed vapor flow intensity.

Preferably, the evaporator should have an additional membrane with an aperture identical with that of the main membrane, to provide means for correcting the distribution of the directed vapor flow intensity, these membranes being spaced from each other and connected to each other about the perimeter of the apertures. Corresponding portions of the tube are rigidly connected.

It is also advisable that the aperture in the membrane be shaped as two truncated cones joined to each other by their small bases.

Beneficially, the evaporator should have two identical membranes with annular apertures, said membranes being secured at the ends of the tube at equal distances from its symmetry plane to provide means for correcting the distribution of directed vapor flow intensity.

Preferably, the evaporator should have a membrane arranged in the tube symmetry plane to provide means for correcting the directed vapor flow intensity.

Preferably, the evaporator should have two identical membranes having apertures, of which the configuration conforms to the configuration of the film to be deposited, these membranes being spaced at the ends of the tube at equal distances from the tube symmetry plane to provide means for correcting the shape of the directed vapor flow.

It is further preferable that the evaporator should have two identical nozzles arranged at the ends of the tube and spaced equally from its symmetry plane to provide means for correcting the shape of the directed vapor flow.

Advisably, the evaporator comprises a porous insert disposed inside the crucible with a clearance relative to the walls thereof, this insert accommodating the evaporant and having an overall volume of pores equal to or greater than the volume of the evaporator.

In view of the aforedescribed, the proposed evaporator eliminates losses of evaporant which fails to be impinged onto the substrate during its recovery for reuse, ensures deposition of a more uniform film thickness, reduces losses of the evaporant associated with vapor deposition on substrates of various shapes and dimensions, and makes use of any evaporant materials practised in the thin film technology. In addition, the proposed evaporator can operate within a wide range of crucible loads, viz., from once-through evaporation of large quantities of evaporant materials (to tens of grams) to the smallest amounts (in the order of fractions of one milligram) sufficient for depositing a single film. The evaporator is structurally simple, easy to fabricate and operate, and can be used with equal success for depositing on both stationary and movable substrates when ganged-up with any industrial vacuum generating units, including automatically controlled units, without resorting to their modification.

BRIEF DESCRIPTION OF THE DRAWINGS

The invention will now be described in greater detail with reference to various specific embodiments thereof taken in conjunction with the accompanying drawings, in which.

BEST MODE OF CARRYING OUT THE INVENTION

Figure 1:
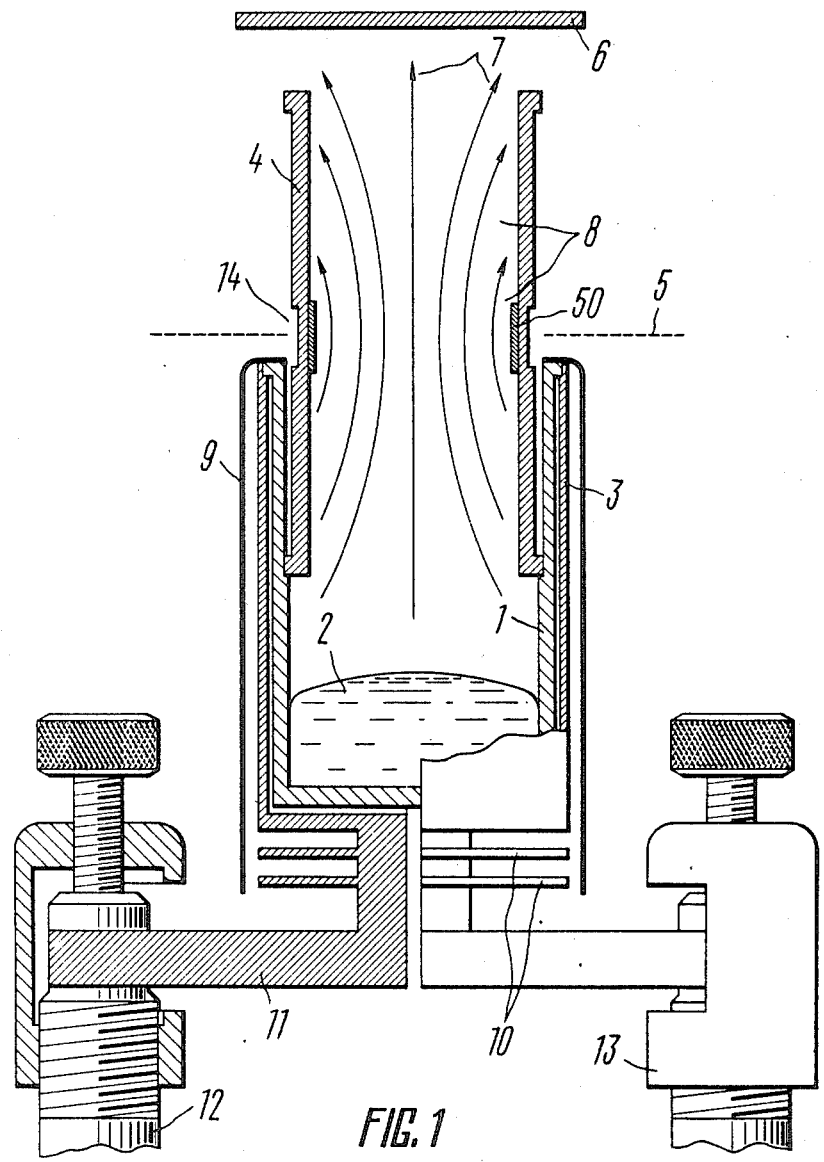
FIG. 1 is a partial longitudinal sectional view of an evaporator for depositing films in a vacuum according to the invention.

Referring to FIG. 1 of the drawing, the evaporator for depositing thin films in a vacuum according to the invention comprises a crucible 1 containing an evaporant 2 and disposed in the heating zone produced by a heater 3; the crucible 1 communicates with a means for forming a directed flow of evaporant fashioned as a tube 4 with one end thereof secured in the crucible 1 and having a transverse symmetry plane 5 to enable alternately one and the other end of the tube 4 to be arranged in the crucible 1. Overlying the tube 4 is a substrate 6 which blocks the travel path of the directed flow 7 of the evaporant escaping from the tube 4, this path being indicated by arrows. The lower high-temperature portion of the tube 4 occupying the heating zone is heated to a temperature equal tot he vaporization temperature of the evaporant 2. The temperature of the upper portion of the upper portion of the tube 4 is below the melting point of the evaporant 2 due to the fact that it is outside the heating zone and due to that it radiates heat. At this low-temperature portion of the tube 4 peripheral regions 8 of the vapor flow failing to impinge onto the substrate 6 tend to be condensed into a solid phase. Between these high temperature and low temperature portions of the tube 4, in a narrow transition zone, vapor is condensed to a liquid phase, which in the course of deposition flows to the high temperature portion of the tube to be revaporized.

As has been stated above, the tube 4 has a transverse plane 5 of symmetry, which makes it possible to fit the tube 4 periodically by one or the other end thereof in the crucible 1 providing for recuperation of the material condensed in the tube 4 for repeated evaporation.

In order to prevent heat losses in the evaporator, there is provided a thermal screed 9 fabricated, for example, from molybdenum, and embracing the heater 3.

The crucible 1, tube 4, and heater 3 are fabricated, for example, from graphite. In the embodiment disclosed herein the heater 3 is made integral with thermal shields 10 arranged under the heater 3 and with current supply leads 11. These leads 11 also serve to secure the evaporator immediately on inlets 12 of a vacuum generating unit (not shown) by means of clamps 13.

Figure 4:
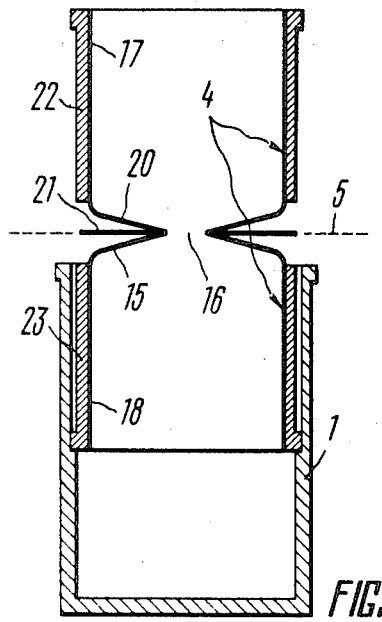
FIG. 4 shows the same as illustrated in FIG. 3 with an additional membrane connected to the main one about the perimeter of the apertures and with a thermal shield.

With reference to FIG. 4, in order to increase the escape angle of the directional flow of vapor, the tube 4 has a varying cross-section lengthwise thereof, particularly it comprises two portions of tapered cone configuration facing one another by small bases. This enables films to be deposited of uniform thickness on a substrate of considerable surface area.

The tube 4 can be threadingly secured in the crucible 1. Such a manner of arranging is preferable for attaining high rates of deposition (vz., hundreds of Ångström per second), because otherwise the tube 4 can be forced out of the crucible 1 by the pressure of vapor of the material being deposited.

Alternatively, other modifications of the tube 4 are possible, for example, when its cross-sectional area at the ends is minimized. In such arrangements the tube 4 must remain symmetrical relative to the plane 5.

Figure 2:
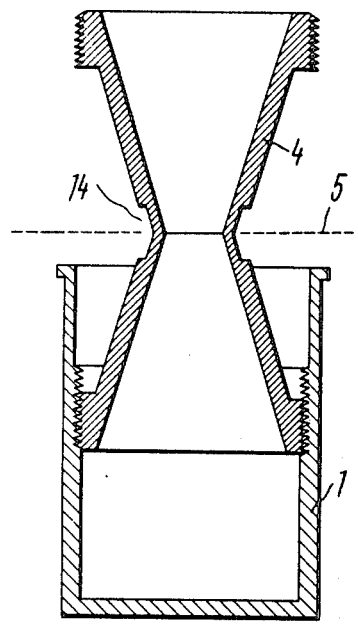
FIG. 2 is a longitudinal sectional view of a crucible having a tube with varying cross-section of the evaporator according to the invention.

For improving the temperature gradient in the midportion of the tube 4 there is provided at least one annular recess 14 (FIGS. 1 and 2). Such an increase in the temperature gradient in the midportion of the tube 4 shortens the length of the transition zone between the high-temperature and low-temperature portions. Therewith, the length of the transition zone will be less than the length of the recess 14. The provision of the recess 14 is essential, when the tube 4 is fabricated from a high heat-conductivity material, such as graphite or refractory metal.

When the tube 4 has one annular recess 14 and if it is fabricated from a material not wettable by the evaporant, the latter tends to accumulate in the area of this recess 14, since due to the lack wetting capacity the downflow of the material is hampered, whereas the vaporization rate from this area is less than the rate of condensation. The recess 14 per se, even after fitting the tube 4 in the crucible 1 by the other end thereof, is away from the heating zone to likewise accumulate the evaporant. The evaporant accumulating in the area adjacent the recess 14 tends to bring down the thermal resistance in the midportion of the tube 4 and expand the liquid phase transition zone, which causes extra losses due to vaporization of the evaporant in the transition zone, provided the vapor pressure thereof at the level of its melting point is substantial. In this case there must be provided a greater number of such recesses 14. If, for example, two recesses (not shown) are provided in the midportion of the tube 4 and the lower part of the tube up to the upper recess is arranged in the heating zone, then condensation occurs only in the heating zone of the upper recess and thereabove, i.e., in the region overlying the plane of symmetry. Subsequent to the top-to-bottom rearrangement of the tube, the entire condensation zone occupies the heating zone, whereby the material condensed thereon tends to vaporize.

Figure 3:
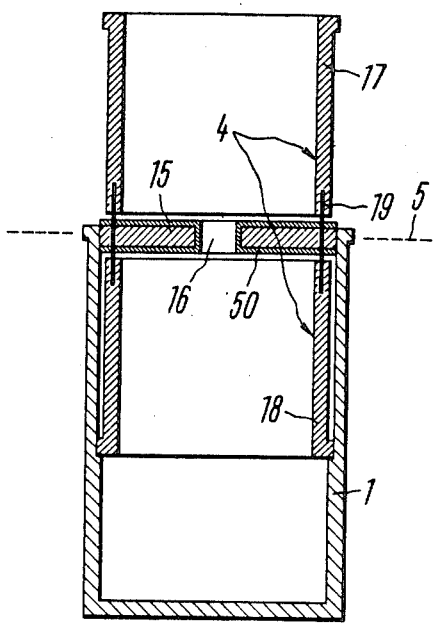
FIG. 3 is a view of the same as shown in FIG. 2 with a membrane arranged in the symmetry plane of the tube.

Referring now to FIG. 3 of the drawings, the proposed evaporator also comprises arranged inside the tube 4 a means for correcting the distribution of the intensity of the directed flow 7 of the vaporant fashioned as a membrane 15 with an aperture 16 resting in the symmetry plane 5 of the tube 4. The tube 4 in the herein described modification is made up of two portions 17 and 18 interconnected therebetween and connected to the membrane 15 by means of pins 19 fabricated from a refractory material. The membrane 15, as well as the lower portion 18 of the tube 4, occupies the heating zone and is heated to the vaporization temperature of the evaporant. The upper portion 17 of the pipe 4 has a temperature below the melting point of the material being deposited. With such an arrangement of the tube 4 there is no transition zone in which condensation to a liquid phase could take place.

In the modified form of the proposed evaporator represented in FIG. 4 the means for correcting the distribution of flow intensity comprises an additional membrane 20 with an aperture 16 substantially identical to the main membrane 15. The membranes 15 and 20 are separated by a space and interconnected about the periphery of the apertures 16. Therewith, the tube 4, as is shown in FIG. 3, comprises two like portions 17 and 18 spaced relative to each other and carrying the membranes 15 and 20. The membrane 15 is rigidly connected to the lower portion 18 of the tube 4, whereas the membrane 20 is connected to the upper portion 17 of the tube 4. At least one thermal shield 21 serving to increase the temperature gradient in the midportion of the tube 4 can be provided between the membranes 15 and 20. Also facilitating an increase in the temperature gradient is the high thermal resistance of the membranes 15 and 20 in the radial direction.

The membranes 15 and 20 rest in a transition zone between the high-temperature (portion 18) and low-temperature (portion 17) sections of the tube 4, whereby the liquid phase of the evaporant tends to condense on the underside of the membrane 15 for the thus condensed material to flow down to the lower portion 18 of the tube 4 where it is revaporized. However, the liquid phase condensation zone in the above-described construction faces the high-temperature section of the tube 4, and therefore evaporation from this zone produces no extra losses. The arrangement of the thermal shield 21 between the two membranes 15 and 20 aims at attaining condensation of solid phase on the upper surface of the membrane 20. The thickness of the thus condensed layer of the evaporant is negligiable due to the low intensity of vapor delivery to the surface of the membrane resting at an angle of close to 90° to the axis of the aperture 16. It is thanks to such an angle that the layer of evaporant condensed on the upper surface of the membrane 20 practically does not affect the thermal resistance of the membrane 20.

The tube 4, as well as the membranes 15 and 20 and the thermal shield 21, can be fabricated from a sheet refractory metal, whereas for mounting in the crucible 1 it is provided with graphite rings 22 and 23 to seal the area of contact and prevent bonding of the tube 4 to the crucible 1.

Figure 5:
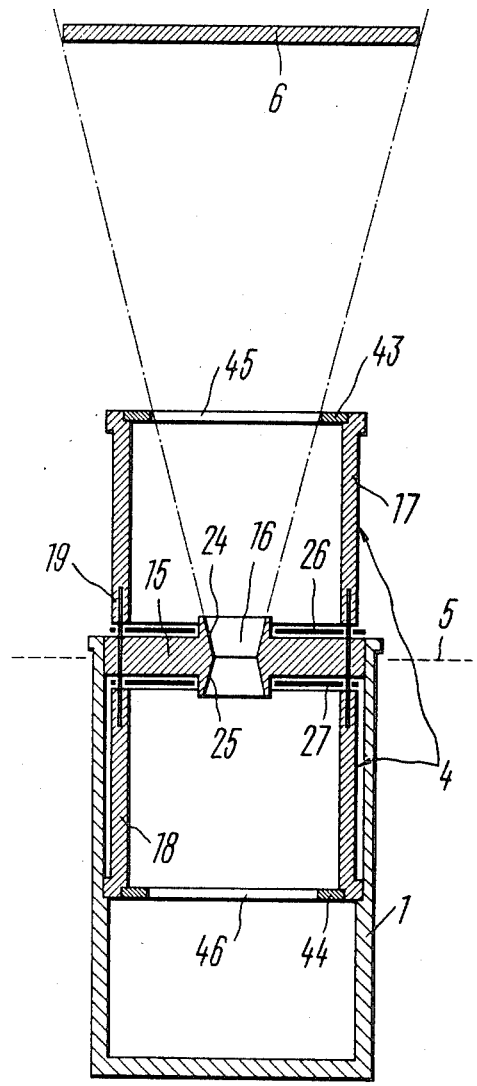
FIG. 5 shows the same as illustrated in FIG. 3 with a shaped aperture in the membrane, thermal shields, and additional membranes secured at tube ends.

With reference to FIG. 5, an alternative embodiment of the evaporator for depositing films is possible in which the membrane 15 secured in the tube 4 has an aperture 16 having cross-sectionally the shape of two truncated cones 24 and 25 interconnected by the smaller cone bases and lying in the symmetry plane 5 of the tube 4. This shaped aperture 16 provides a more uniform intensity of the directed flow of the evaporant toward the substrate as compared with the cylindrical aperture.

Thermal shields 26 and 27 are interposed between the membrane 15 and portions 17 and 18 of the tube 4. The upper shield 26 serves to increase the pressure differential between the membrane 15 and upper portion 17 of the tube 4. The membrane 15 occupying the heating zone is heated through its side surface for which purpose it can have a larger surface area.

To ensure a more vigorous heating of the membrane 15, the cross-section of the heater 3 (FIG. 1) may be reduced to result in an increased liberation of energy in the heating zone.

The construction of the tube 4 makes use of only one heater, since under any conditions of film deposition a solid phase condensation will always take place in the low-temperature portion of the tube and vaporization will occur in its high-temperature portion. The use of one heater simplifies the control and maintenance of a required temperature thus making the evaporator structurally less complicated.

The means for correcting the distribution of intensity of the flow of evaporant is also fashioned as two substantially identical membranes 28 and 29 (FIG. 6) provided with annular openings or apertures 30 and 31, respectively, and having an inner diameter $D_1$ and outer diameter $D_2$. The membranes 28 and 29 are secured at the ends of the tube 4 equidistantly from the plane 5 of symmetry. The tube 4, as well as the membranes 28 and 29, can be fabricated from, for example, a refractory sheet metal, whereas graphite rings 22 and 23 can be fitted thereon to facilitate its arrangement in the crucible 1.

In terms of temperature distribution, such a tube 4 is substantially similar to one shown in FIG. 1. Below a plane 32 (FIG. 6) is a high-temperature portion of the tube 4 from which the evaporant concentrated thereon during the preceding deposition cycle is vaporized. Therefore, the cross-section of the tube 4 in the plane 32 represents a source emitting the flow of vapor to be impinged on the substrate 6. Upwards of the plane 32 the evaporant starts to condense on the walls of the tube 4 and on the membrane 28. Confined by the annular aperture 30, the inner surface of the membrane 28 the edge of which lies in a plane 34 tends to collect part of the flow of evaporant, thereby reducing the rate of deposition in the center of the substrate to result in a more uniform thickness of the film deposited on the entire surface area of the substrate. The inner edge of the outer portion 35 of the membrane 28 rests in a plane 36.

Figure 6:
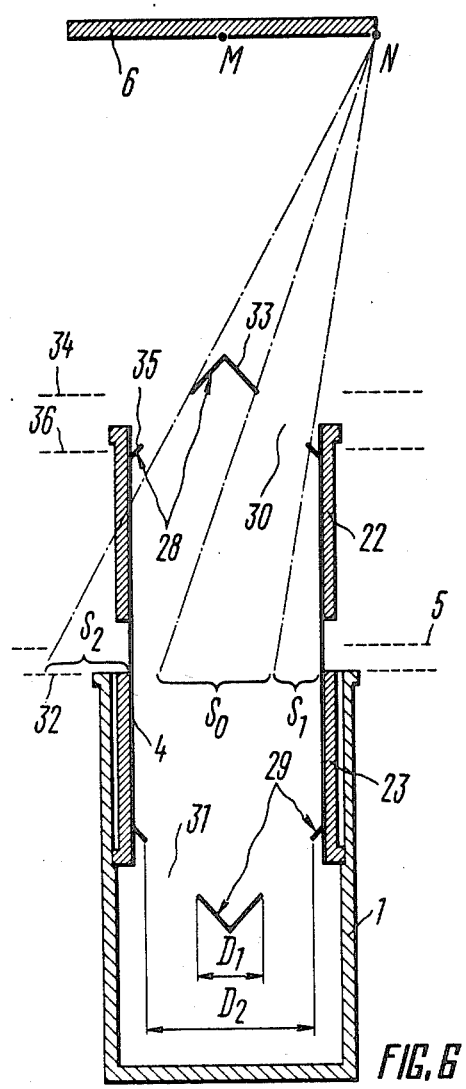
FIG. 6 is a modified form of the evaporator according to the invention with membranes at the tube ends having annular apertures.
Figure 7:
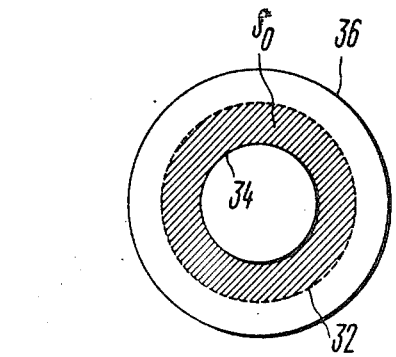
FIG. 7 is a profile of the effective emission surface of the evaporator with reference to FIG. 6 with respect to the center of the substrate.
Figure 8:
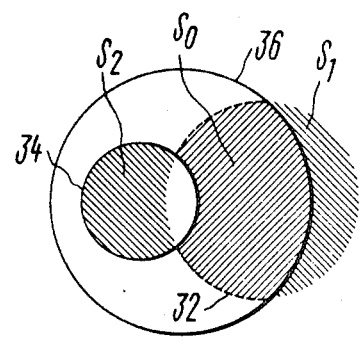
FIG. 8 is the same as shown in FIG. 7 with respect to the edge of the substrate.

Referring now to FIGS. 7 and 8, there are shown effective emission surfaces as seen from the points M and N on the substrate 6, as best seen in FIG. 6. The effective emission surfaces are formed by the cross-section of the tube 4 (FIG. 6) in the plane 32 (FIGS. 6, 7 and 8) and by the membrane 28 (FIG. 6) in the plane 34 and 36 (FIGS. 6, 7 and 8).

Figure 9:
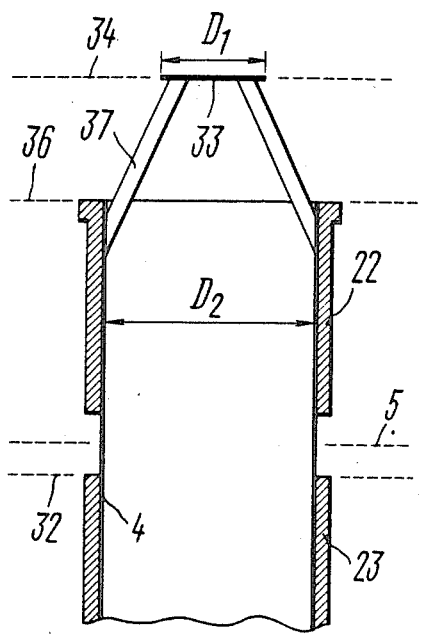
FIG. 9 shows the same as illustrated in FIG. 6 with support members for securing the inner portion of the membrane.
Figure 10:
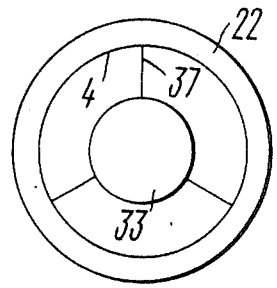
FIG. 10 is a view from above of what is shown in FIG. 9.

FIGS. 9 and 10 represent one of possible modified forms for securing the inner portion 33 of the membrane 28 (FIG. 6) at the end of the tube 4 by means of support members 37 minimized in cross-section to allow a free passage of vapor (for the sake of clarity the outer portion 35 of the membrane 28 is not shown). The inner portion 33 of the membrane may have the form of a flat disk having a diameter $D_1$. The outer diameter $D_2$ of the annular aperture 30 (FIG. 6) can be equal to the inner diameter of the tube 4, and in this case the outer part of the membrane is absent, whereas the upper end of the tube 4 functions as the outer portion of the membrane.

The means for correcting the distribution of intensity of the flow of evaporant can be fashioned as a membrane 38 provided with a plurality of apertures 39 (FIG. 11) geometrical axes 40 (FIG. 12) of which are arranged at predetermined angles relative to one another and to a geometrical axis 41 of the tube 4 (FIG. 11), this membrane being secured in the tube 4 in the symmetry plane 5 thereof. Each aperture 39 (FIG. 12) is capable to effect angular distribution 42 of the intensity of vapor emission indicated by the dotted line.

The value of angle $\beta$ between the axes 40 of the apertures 39 and the axis 41 of the tube 4 (FIG. 11) is selected proceeding from obtaining an overall distribution of intensity of flow emission from all the apertures 39, which would ensure uniform thickness of the film being deposited within the escape angle $\alpha$ (FIG. 11) of the directed flow of evaporant.

Figures 11, 12:
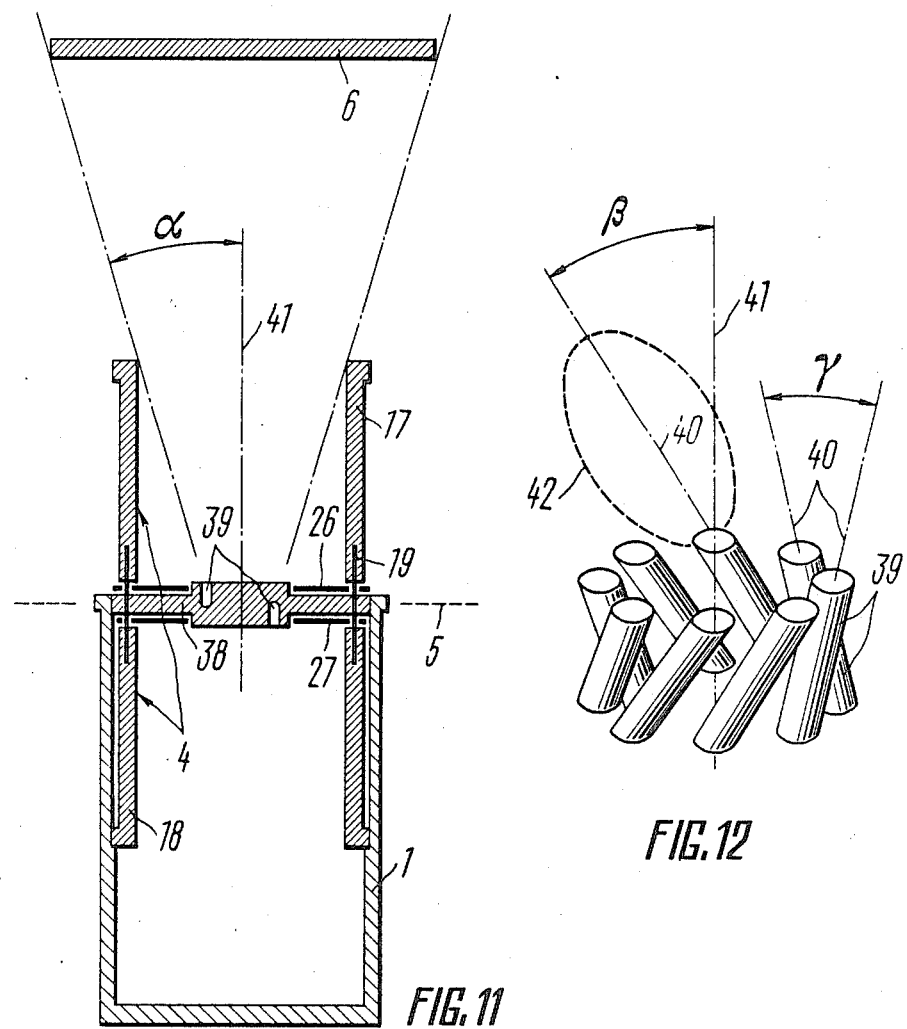
FIG. 11 shows the same as illustrated in FIG. 3 with a membrane having a plurality of apertures.
FIG. 12 is an enlarged axonometric view of the aperture in the membrane shown in FIG. 11.

In the general case the angle $\beta$ (FIG. 12) can range from 0° to 55°; the geometrical axes 40 of the apertures 39 being arranged at different (not shown) angles $\beta$ to the geometrical axis 41 of the tube 4 (FIG. 11). The latter provision is especialy preferable at the maximum values of the angle $\beta$ (FIG. 12) approaching 55°, because in this case with the axes 40 of all the apertures 39 arranged at the maximum angles $\beta$ the intensity of the directed flow of evaporant in line with the axis 41 of the tube 4 (FIG. 11) is reduced to such an extent that the thickness of evaporant deposition on the center of the substrate 6 tends to become less than on the substrate portion edges. Arranging the geometrical axes 40 (FIG. 12) of some of the apertures 39 at smaller angles $\beta$ to the geometrical axis 41 of the tube 4 increases the intensity of the directional flow of evaporant escaping in line with this axis 41 thus equalizing or making more uniform the thickness of the film being deposited on the entire surface of the substrate 6 (FIG. 11).

When increasing the maximum values of the angle $\beta$ (FIG. 12) to more than 55°, no substantial increase in the angle $\alpha$ occurs.

The maximum value of the angle $\gamma$ between the axes 40 of the adjacent apertures 39 is preferably such as to prevent reduced emission intensity in the direction between these axes. With a fixed value of the angle $\beta$ the angle $\gamma$ tends to reduce in response to increasing the number of apertures 39.

If, for example, the angle $\beta$ is 45°, then the angle $\alpha$ makes 30°, whereby at the tube 4 diameter of 20 mm the distance therefrom to the substrate of 155 mm it becomes possible to deposit the evaporant to a substrate 200 mm in diameter.

The evaporator also comprises a means for correcting the shape of the directed flow of vapor having the form of identical membranes 43 and 44 arranged inside the tube 4 (FIG. 5) and having apertures 45 and 46 of a configuration conforming with the shape of the film to be deposited. These membranes 43 and 44 are secured at the ends of the tube 4 equidistantly from the symmetry plane 5 thereof.

When, for example, depositing the evaporant on a rectangular substrate 6, the apertures 45 and 46 are accordingly rectangular. The vapor flow escaping from the aperture 45 in the upper membrane 43 is rectangular in cross-section to ensure a deposition of a film of uniform thickness on the substrate 6, the flow intensity suddenly dropping behind the substrate 6 thus minimizing losses of the evaporant.

When depositing on a moving substrate 6, the shape of the apertures 45 and 46 is selected by taking into consideration the travel path of the substrate 6, which determines the configuration of the film being deposited. For example, when depositing on a revolving substrate 6 (with the axis of rotation not passing through the substrate 6), the shape of the apertures 45 and 46 is preferably trapezoidal, the sides of the trapeze being preferably concave for ensuring a thickness uniformity of the film being deposited, since the central sections of such a substrate 6 move under a zone of somewhat increased flow intensity.

Figure 13:
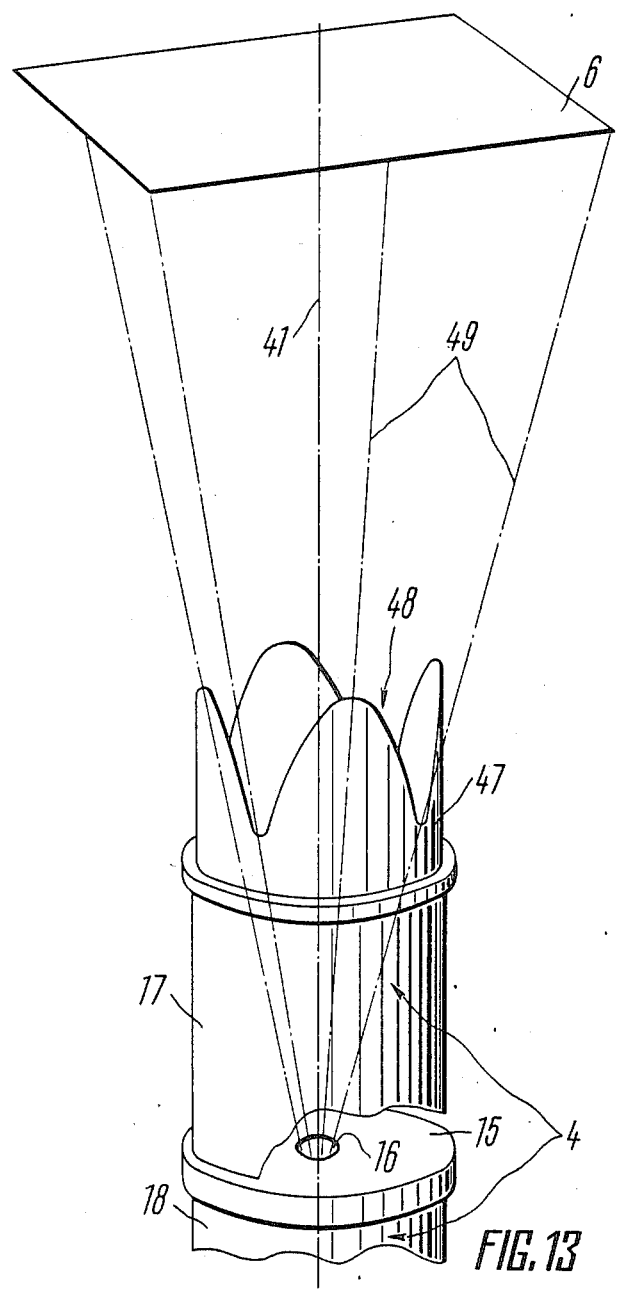
FIG. 13 is an axonometric view of a portion of the tube having shaped cut-outs.

The means for correcting the shape of the directional flow of vapor can alternatively have the form of identical nozzles 47 (FIG. 13) attached to the ends of the tube 4 equidistantly from its transverse plane of symmetry and having shaped cut-outs indicated at 48 corresponding to the configuration of the film being deposited (the lower nozzle not being shown).

The configuration of the shaped cut-out 48 is defined by the intersection of the surface of the nozzle 47 with a surface obtained by continuously moving a straight line 49 along three guide lines which are the axis 41 of the tube 4, perimeter of the aperture 16 and perimeter of the film coinciding with the perimeter of the substrate 6.

The thus directed flow of vapor escaping from the tube 4 provided with such a nozzle 47 conforms in the plane of the substrate 6 to its configuration, whereby losses of the evaporant are minimized.

In addition, at least the midportion of the inner surface of the tube 4 (FIG. 1) is provided with a coating 50 of a refractory material wettable by the evaporant. This facilitates the flow of the liquid phase from the transition zone neighbouring the recess 14 to the high-temperature section of the tube in the heating zone for revaporization. The entire inner surface of the tube 4 can be coated with a material wetted by the evaporant. In such an arrangement subsequent to the replacement of the tube 4 and melting of the deposition material condensed thereon the latter is vaporized from the surface of the tube 4 rather than fall to the crucible 1. When the inner surface of the tube 4 is not coated with such a wettable layer, the vaporant drops condensed on the surface of the tube 4 tend to break away therefrom and spatter during their fall to the crucible 1 to result in flaws in the film deposited.

Each membrane 15 (FIGS. 3, 4 and 5), 20 (FIG. 4), 28 and 29 (FIG. 6), 38 (FIG. 11), 43 (FIG. 5) and 44 can be coated with the material 50 (shown only in FIG. 3) to be wetted by the evaporant. For example, when the membranes 15 (FIG. 4) and 20 have a coating wettable by the evaporant, the downflow of the liquid phase from the lower membrane 15 to the lower portion 18 of the tube 4 is greatly facilitated. To prove the point, for depositing silver the membranes 15 and 20 fabricated from molybdenum or tungsten are coated with niobium. When the membranes 43 (FIG. 5) and 44 are coated with a material wettable by the evaporant, the evaporant condensed on these membranes is retained thereon even after it is melted, thereby obviating the formation of spatter caused by falling to the crucible 1. The provision of the membrane 15 (FIG. 3) having a coating 50 wettable by the evaporant eliminates the possibility of breaking away by the evaporant flow and transfer thereby to the substrate of the drops of the evaporant condensed on the membrane 15 in case it is not heated to the vaporization temperature, or in case in the course of applying heat thereto its temperature elevates at a rate slower than that of the evaporant heated in the crucible due to the substantial mass of the membrane.

The tube 4 arranged in the crucible 1, while reducing the flow section of the crucible, provides a pressure of the evaporant to saturated vapor, which changes the evaporation process and increases the likelihood of spatter to enter the flow of the material being deposited. Also, reduced cross-section of the flow of evaporant in the tube 4 affects the rate of deposition, which in turn requires higher temperature of the crucible 1 to maintain the required rate of film deposition again increasing the probability of spatter. To obviate this disadvantage, the proposed evaporator has a porous insert 53 (FIG. 14) secured on a support member 51 in the crucible 1 with a clearance relative to the walls of the crucible, this insert being charged with the evaporant so that the overall volume of its pores is equal to or more than the volume of the evaporant to be deposited. A recess 54 can be provided in the insert 53 to accommodate the evaporant. The molten evaporant occupies the pores of the insert 53 to prevent the formation of thick layers of the evaporant capable of spatter.

Thanks to the employment of the insert 53, evaporation involves a thin layer on its entire porous surface of the insert which the material to be deposited tends to occupy by virtue of capillary forces and wetting. Such extensive evaporation surface is also favourable for increasing the rate of film deposition, for which purpose the insert 53 can be fabricated from granular ceramics.

The evaporator for depositing films in a vacuum operates in the following manner.

The material to be deposited or evaporant 2 (FIG. 1) is charged into the crucible 1 with the tube 4 being removed, after which the tube 4 is fitted on the crucible 1. subsequent to arranging the substrate 6, a working underpressure is produced in the vacuum chamber (not shown). The heater 3 is then energized to increase the temperature of the material 2 to be deposited to the vaporization point. The vapor enters the tube 4 which forms a directed flow 7 to impinge on the substrate 6. Part of the vapor failing to reach the substrate 6 tends to condense on the upper low-temperature portion of the tube 4.

After depositing on the substrate 6 a film of required thickness the heater 3 is deenergized. Then, if necessary, the crucible 1 is replenished with the evaporant, and the tube 4 is turned upside down to be fitted in the crucible 1 by the end thereof on which the evaporant is deposited which failed to reach the substrate 6. This evaporant is put to use in a subsequent deposition cycle in the same manner the material occupying the crucible 1 is used.

The evaporator having the tube 4 (FIG. 2) of varying cross-section operates substantially in a similar manner. This arrangement ensures a greater escape angle of the flow making it possible to cover a substrate of larger surface area. However, the layer of the evaporant tending to condense on the low-temperature portion of the tube 4 above the recess 14 in the course of prolonged deposition operation causes reduction in the cross-section of the tube 4 to result in undesirable changes in the shape of the evaporant flow. Therefore, such a tube 4 can be used with advantage for depositing thin films.

The evaporator comprising the membrane 15 (FIG. 3) in the tube 4 having the aperture 16 resting in the symmetry plane of the tube 4 also operates in a similar manner. The escape angle of the directed flow of evaporant is determined by the ratio between the diameters of the aperture 16 and tube 4, as well as by the length of the tube 4. In the evaporator described with reference to FIG. 3 it is possible to vary the diameter of the aperture 16 within a wide range (otherwise, it is possible use different membranes). This enables the cosine distribution of intensity of the evaporant flow escaping from the aperture 16, and thereby provides a more uniform thickness of the film deposited on the substrate as compared with evaporators not provided with membranes in the tubes 4 (FIGS. 1 and 2).

In addition, vapors being condensed form only a solid phase on the inner surface of the upper portion 17 (FIG. 3) of the tube 4. This circumstance allows deposition of films of practically any desired materials, particularly those that vaporize from the solid phase, such as most sulfides, the vapor pressure of which after melting exceeds atmospheric pressure.

Further, the condensation zone at the upper portion 17 of the tube 4 is removed from the aperture 16, and therefore the layer of evaporant tending to grow thereon even when depositing thick films fails to noticeably affect the distribution of vapor flow intensity impinged on the substrate.

The modified form of the proposed evaporator with reference to FIG. 4 operates in the like manner. The means for correcting vapor flow intensity comprises an additional membrane 20 in structure identical to the main membrane 15 and connected thereto about the periphery of the aperture 16. Solid phase tends to accumulate here on the upper portion 17 of the tube 4 and on almost entire upper surface of the membrane 20. Liquid phase of the evaporant is condensed on the underside of the membrane 15 to drain down the lower portion 18 of the tube 4 and be vaporized there.

The evaporator provided with such a tube 4 ensures as efficient distribution of vapor flow intensity as one shown in FIG. 3, although it is applicable for a less wide range of evaporants. However, the tube 4 illustrated in FIG. 4 is structurally simpler, and can be fabricated as a unit, for example, from graphite. Another advantage is that it makes no use of such connecting elements as thin pins 19 used in the tube 4 construction shown in FIG. 3.

The evaporator illustrated in FIG. 5 operates in the same manner as one shown in FIG. 3, the difference being in that the flow of evaporant while passing through the walls of the shaped aperture 16 (FIG. 5) accelerates, according to the laws of hydrodynamics, to a supersonic speed. In addition, this evaporator features uniform distribution of vapor flow intensity.

The upper thermal shield 26 acts to increase temperature differential between the membrane 15 and upper portion 17 of the tube, which is essential for depositing materials of high vaporization temperature, such as gold. The lower thermal shield 27 functions only after the tube 4 is fitted into the crucible 1 by its opposite end.

The upper membrane 43 has the aperture 45 having a shape conforming to the configuration of the film being deposited, this aperture correcting the cross-section of the directed flow of vapor to correspond with the shape of the substrate 6. The evaporant tends to condense on the membrane 43 and on the upper portion 17 of the tube 4 to a solid phase. At the same time, the evaporant condensed on the lower membrane 44, as well as on the lower portion 18 of the tube 4, tends to revaporize. After replacing the tube 4 by its other end in the crucible 1, the membrane 43 and the portion 17 of the tube 4 assumes the bottom position in the heating zone for the evaporant condensed thereon to vaporize.

The evaporator with reference to FIG. 6 operates in a manner described heretofore. The tube 4 has secured at the ends thereof membranes 28 and 29 having annular apertures 30 and 31, respectively. The upper membrane 28, as the membrane 43 shown in FIG. 5, collects some evaporant, and after placing the tube 4 (FIG. 6) in the crucible 1 by its opposite end the membrane occupies the heating zone for the evaporant condensed thereon to vaporize. This modification of the evaporator is distinguished by the shape and arrangement of the membrane 28 (FIG. 6) thereby enabling correction of the distribution of evaporant flow intensity through the surface area of the substrate 6.

Represented in FIG. 7 by the hatched region $S_o$ is the effective emission surface viewed from the point M (FIG. 6) in the center of the substrate 6. The rate of film deposition in the center of the substrate 6 is proportional to the surface area of this region $S_o$.

As can be seen, a considerable part of the area of the emission source (contour 32 in FIG. 7) is shaded by the inner portion 33 of the membrane 28 (contour 34 in FIG. 7). The effective emission surface for the point N at the edge of the substrate 6 is depicted by the region $S_o$ in FIG. 8. The emission source (contour 32) starts to be shaded by the outer portion 35 (FIG. 6) of the membrane 28 (contour 36 in FIG. 8), the shaded area being $S_1$ (FIG. 8). However, reduced simultaneously by a value $S_2$ is the area of shading of the emission source by the inner portion 33 (FIG. 6) of the membrane 28 (contour 34 in FIG. 8). By selecting the relationship between dimensions of the tube 4 and membrane 28 it is possible to equalize the effective emission area $S_o$ for the center and edge portion of the substrate, or even provide a margin for the edge of the substrate 6, which would compensate for the natural cosine law of the source emission and thereby ensure uniform thickness of the film being deposited.

The centers of the membranes 28 and 29 can be provided with holes (not shown) to still more closely follow the law of varying the area of effective emission surface at the substrate 6 relative to the inversely proportional cosine law. This ensures still further the deposition of uniform film thickness.

The modification of the evaporator represented in FIGS. 9 and 10 having secured at the ends of the tube 4 membranes with annular slots operates substantially as was described heretofore. In this modification the plane 36 rests at the level of the upper end face of the tube 4 which functions as the outer portion of the membrane. The annular aperture 30 is arranged similarly to one shown in FIG. 6, and the character of variations in the effective emission surface remains the same as described with reference to FIGS. 7 and 8. Support members 37 (FIGS. 9 and 10) do not hamper the free flow of evaporant.

Referring now to FIG. 11, secured to the tube 4 of the evaporator is a membrane 38 having a plurality of apertures 39. Condensed on the upper portion 17 of the tube 4 is the solid phase of the evaporant. Because the membrane 38 occupying the heating zone is heated to the vaporization temperature, no evaporant is condensed thereon, and the vapor of the material being deposited passes freely through the apertures 39 in the membrane 38. Arranged at the angle $\beta$ (FIG. 12) to the axis 41 of the tube 4, these apertures 39 guide the evaporant in line with their respective geometrical axes 40 to form a flow of vapor of highly uniform intensity deposited on the substrate.

The modified form of the proposed evaporator (FIG. 13) which is provided with shaped nozzles 47 having shaped cut-outs 48 operates substantially as the device described with reference to FIG. 5 in which secured to the ends of the tube 4 are membranes 43 and 44 having apertures 45 and 46 in shape conforming to the configuration of the film deposited on the substrate. The nozzle 47 (FIG. 13) with the shaped cut-out 48 corrects the cross-sectional outline of the directional evaporant flow to correspond to the configuration of the film being deposited on the substrate. This nozzle 47 ensures a sudden drop in vapor flow intensity outside the substrate as compared with the membrane 43 (FIG. 5) having the aperture 45 in shape also corresponding to the configuration of the film at equal diameters of the tube 4.

Figure 14:
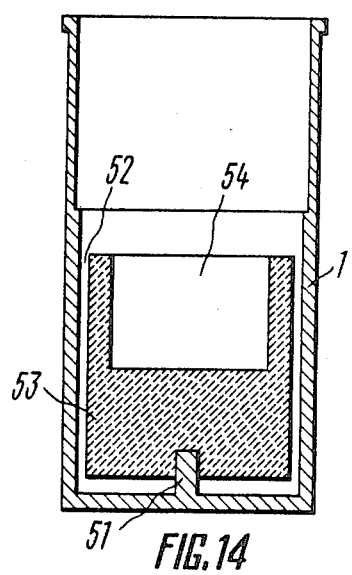
FIG. 14 is a longitudinal sectional view of the crucible provided with a porous insert.

Referring now to the embodiment of the proposed evaporator represented in FIG. 14, it operates in the following manner.

The material to be deposited is charged into the recess 54 provided in the porous insert 53. Subsequent to producing a required underpressure in the vacuum chamber, the crucible with the porous insert 53 and evaporant occupying the crucible are heated for the evaporant to melt and penetrate the pores of the insert 53. Because the volume of the open pores of the insert 53 is equal to or even greater than the volume of the material being charged, the latter tends to occupy these pores of the insert 53 elevating to the surface of the insert as it vaporizes. The thus vaporized material is forced along the tube 4 toward the substrate. This porous insert 53 provides a larger vaporization surface, and consequently a more stable film deposition rate even with small amounts of the evaporant.

In addition, while evaporating uniformly from the entire surface of the insert 53, the evaporant forms a flow of equal cross-sectional intensity to thereby ensure uniformly distributed escape of the flow from the tube.

INDUSTRIAL APPLICABILITY

The evaporator for depositing in a vacuum films predominantly of precious materials, such as gold, platinum, silver, palladium and the like, can find application in electronics, optics, acoustics, radio and electrical engineering for fabricating, for example, integrated circuits, tapered strip UHF lines, metal plating of various electronic components, printed circuits and tapes, as well as for depositing optical coatings.

We claim:

1. An evaporator for depositing a film in a vacuum, comprising:
   a crucible for containing an evaporant material adapted to be heated to evaporate the evaporant material to establish a directional vapor flow toward a substrate upon which a film is to be deposited;
   and tube means removably mounted in said crucible for forming a directional flow of vapor of evaporant material to be deposited and having mounting means on each end thereof for selectively removably mounting said tube means in said crucible, said tube means defining a transverse symmetry plane to enable said tube means to be mounted alternately with one of its ends mounted in said crucible and then removed and mounted with its other end in said crucible, said tube means having a variable cross section lengthwise.

2. An evaporator for depositing a film in a vacuum, comprising:
   a crucible for containing an evaporant material adapted to be heated to evaporate the evaporant material to establish a directional vapor flow toward a substrate upon which a film is to be deposited;
   and tube means removably mounted in said crucible for forming a directional flow of vapor of evaporant material to be deposited and having mounting means on each end thereof for selectively removably mounting said tube means in said crucible, said tube means defining a transverse symmetry plane to enable said tube means to be mounted alternately with one of its ends mounted in said crucible and then removed and mounted with its other end in said crucible, the midportion of said tube means defining at least one annular recess.

3. An evaporator for depositing a film in a vacuum, comprising:
   a crucible for containing an evaporant material adapted to be heated to evaporate the evaporant material to establish a directional vapor flow toward a substrate upon which a film is to be deposited;
   tube means removably mounted in said crucible for forming a directional flow of vapor of evaporant material to be deposited and having mounting means on each end thereof for selectively removably mounting said tube means in said crucible, said tube means defining a transverse symmetry plane to enable said tube means to be mounted alternately with one of its ends mounted in said crucible and then removed and mounted with its other end in said crucible; and
   a membrane supported in said tube means and lying in the transverse symmetry plane of said tube means, said membrane defining an aperture in said symmetry plane and providing for correction of the distribution of intensity of a directional vapor flow.

4. An evaporator for depositing a film in a vacuum, comprising:
   a crucible for containing an evaporant material adapted to be heated to evaporate the evaporant material to establish a directional vapor flow toward a substrate upon which a film is to be deposited;
   tube means removably mounted in said crucible for forming a directional flow of vapor of evaporant material to be deposited and having mounting means on each end thereof for selectively removably mounting said tube means in said crucible, said tube means defining a transverse symmetry plane to enable said tube means to be mounted alternately with one of its ends mounted in said crucible and then removed and mounted with its other end in said crucible; and
   a pair of identical membranes mounted on said tube means, each membrane defining an annular aperture, and said membranes being carried on the ends of said tube means equally spaced from said transverse symmetry plane, said membranes providing for correction of the distribution of intensity of a directional vapor flow.

5. An evaporator for depositing a film in a vacuum, comprising:
a crucible for containing an evaporant material adapted to be heated to evaporate the evaporant material to establish a directional vapor flow toward a substrate upon which a film is to be deposited;
tube means removably mounted in said crucible for forming a directional flow of vapor of evaporant material to be deposited and having mounting means on each end thereof for selectively removably mounting said tube means in said crucible, said tube means defining a transverse symmetry plane to enable said tube means to be mounted alternately with one of its ends mounted in said crucible and then removed and mounted with its other end in said crucible; and
a pair of membranes mounted in said tube means, said membranes defining identical apertures and being arranged in said tube means at an angle to the axis of said tube means with the membranes coupled along the perimeter of their apertures, said tube means formed of a pair of identical tube parts spaced from one another and rigidly coupled by said pair of membranes.

6. An evaporator as claimed in claim 3, wherein said aperture of said membrane is shaped as two cones connected by their small bases.

7. An evaporator as claimed in claim 3, further including a pair of identical nozzles, each having shaped cutouts, formed in the ends of said tube means equally spaced from said transverse symmetry plane, and providing for correction of the shape of the directional vapor flow.

8. An evaporator for depositing a film in a vacuum, comprising:
a crucible for containing an evaporant material adapted to be heated to evaporate the evaporant material to establish a directional vapor flow toward a substrate upon which a film is to be deposited;
tube means removably mounted in said crucible for forming a directional flow of vapor of evaporant material to be deposited and having mounting means on each end thereof for selectively removably mounting said tube means in said crucible, said tube means defining a transverse symmetry plane to enable said tube means to be mounted alternately with one of its ends mounted in said crucible and then removed and mounted with its other end in said crucible; and
a pair of identical membranes, each having an aperture conforming in configuration to the configuration of a film to be deposited, said membranes being secured to the ends of said tube means equally spaced from said transverse symmetry plane.

9. An evaporator for depositing a film in a vacuum, comprising:
a crucible for containing an evaporant material and adapted to be heated to evaporate the evaporant material to establish a directional vapor flow toward a substrate upon which a film is to be deposited;
tube means removably mounted in said crucible for forming a directional flow of vapor of evaporant material to be deposited and having mounting means on each end thereof for selectively removably mounting said tube means, said tube means defining a transverse symmetry plane to enable said tube means to be alternately mounted with one of its ends mounted in said crucible, and then removed and mounted with its other end in said crucible; and
membrane means defining a plurality of apertures mounted in said tube means and lying in the transverse symmetry plane, the geometrical axes of said apertures being arranged at preselected angles with respect to one another and the geometrical axis of said tube means, said membrane means providing for correction of the distribution of intensity of a directional vapor flow.

10. An evaporator for depositing a film in a vacuum, comprising:
a crucible for containing an evaporant material and adapted to be heated to evaporate the evaporant material to establish a directional vapor flow toward a substrate upon which a film is to be deposited;
tube means removably mounted in said crucible for forming a directional flow of vapor of evaporant material to be deposited and having mounting means on each end thereof for selectively removably mounting said tube means, said tube means defining a transverse symmetry plane to enable said tube means to be alternately mounted with one of its ends mounted in said crucible, and then removed and mounted with its other end in said crucible; and
a porous insert received within said crucible and mounted spaced from the interior bottom and side walls of said crucible and having open pores with a volume at least equal to the volume of evaporant material to be contained in said crucible.

11. An evaporator for depositing a film in a vacuum, comprising:
a crucible for containing an evaporant material adapted to be heated to evaporate the evaporant material to establish a directional vapor flow toward a substrate upon which a film is to be deposited;
tube means removably mounted in said crucible for forming a directional flow of vapor of evaporant material to be deposited and having mounting means on each end thereof for selectively removably mounting said tube means in said crucible, said tube means defining a transverse symmetry plane to enable said tube means to be mounted alternately with one of its ends mounted in said crucible and then removed and mounted with its other end in said crucible; and
means for increasing the temperature gradient at the midportion of the tube means to shorten the length of the transition zone between the end of the tube means mounted in said crucible which is subjected to high temperature and the other end of the tube means which is subjected to low temperature.

* * * * *